(12) United States Patent
Harada et al.

(10) Patent No.: US 11,551,907 B2
(45) Date of Patent: Jan. 10, 2023

(54) ELECTRON MICROSCOPE AND SAMPLE OBSERVATION METHOD USING THE SAME

(71) Applicants: RIKEN, Wako (JP); UNIVERSITY PUBLIC CORPORATION OSAKA, Osaka (JP)

(72) Inventors: Ken Harada, Saitama (JP); Keiko Shimada, Saitama (JP); Shigeo Mori, Osaka (JP); Atsuhiro Kotani, Osaka (JP)

(73) Assignees: RIKEN, Saitama (JP); UNIVERSITY PUBLIC CORPORATION OSAKA, Osaka (JP)

( * ) Notice: Subject to any disclaimer, the term of this patent is extended or adjusted under 35 U.S.C. 154(b) by 0 days.

(21) Appl. No.: 17/263,017

(22) PCT Filed: Jul. 26, 2019

(86) PCT No.: PCT/JP2019/029360
§ 371 (c)(1),
(2) Date: Jan. 25, 2021

(87) PCT Pub. No.: WO2020/022469
PCT Pub. Date: Jan. 30, 2020

(65) Prior Publication Data
US 2021/0233741 A1 Jul. 29, 2021

(30) Foreign Application Priority Data
Jul. 26, 2018 (JP) .............................. JP2018-140161

(51) Int. Cl.
*H01J 37/26* (2006.01)
*G01N 23/201* (2018.01)
(Continued)

(52) U.S. Cl.
CPC .......... *H01J 37/265* (2013.01); *G01N 23/201* (2013.01); *H01J 37/09* (2013.01);
(Continued)

(58) Field of Classification Search
CPC .......... H01J 37/265; H01J 37/09; H01J 37/10; H01J 37/147; H01J 37/20; H01J 37/226;
(Continued)

(56) References Cited

U.S. PATENT DOCUMENTS

| 6,570,156 B1 | 5/2003 | Tsuneta et al. |
| 8,642,959 B2 * | 2/2014 | Wang .................... H01J 37/153 250/311 |

(Continued)

FOREIGN PATENT DOCUMENTS

| JP | 2003217498 A | 7/2003 |
| JP | 2007250541 A | 9/2007 |

(Continued)

OTHER PUBLICATIONS

N. Chapman, "The investigation of magnetic domain structures in thin foils by electron microscopy", J. Phys. D: Appl. Phys. 17, 1984, pp. 623-647.

(Continued)

*Primary Examiner* — David A Vanore
(74) *Attorney, Agent, or Firm* — Miles & Stockbridge, P.C.

(57) ABSTRACT

An observation apparatus and method that avoids drawbacks of a Lorentz method and observes a weak scatterer or a phase object with in-focus, high resolution, and no azimuth dependency, by a Foucault method observation using a hollow-cone illumination that orbits and illuminates an incident electron beam having a predetermined inclination angle, an electron wave is converged at a position (height) of an aperture plate downstream of a sample, and a bright (Continued)

field condition in which a direct transmitted electron wave of the sample passes through the aperture plate, a dark field condition in which the transmitted electron wave is shielded, and a Schlieren condition in which approximately half of the transmitted wave is shielded as a boundary condition of both of the above conditions are controlled, and a spatial resolution of the observation image is controlled by selecting multiple diameters and shapes of the opening of the aperture plate.

15 Claims, 14 Drawing Sheets

(51) Int. Cl.
| | | |
|---|---|---|
| *H01J 37/09* | (2006.01) | |
| *H01J 37/10* | (2006.01) | |
| *H01J 37/147* | (2006.01) | |
| *H01J 37/20* | (2006.01) | |
| *H01J 37/22* | (2006.01) | |

(52) U.S. Cl.
CPC ............ *H01J 37/10* (2013.01); *H01J 37/147* (2013.01); *H01J 37/20* (2013.01); *H01J 37/226* (2013.01); *H01J 37/263* (2013.01); *H01J 2237/0451* (2013.01); *H01J 2237/2614* (2013.01)

(58) Field of Classification Search
CPC ............ H01J 37/263; H01J 2237/0451; H01J 2237/2614; H01J 2237/14; H01J 2237/1507; H01J 37/04; H01J 37/266; G01N 23/201; G01N 2223/418; G01N 23/20083

See application file for complete search history.

(56) References Cited

U.S. PATENT DOCUMENTS

| | | | |
|---|---|---|---|
| 8,835,846 B2 | 9/2014 | Buijsse et al. | |
| 9,564,291 B1* | 2/2017 | Own | H01J 37/222 |
| 9,899,186 B1* | 2/2018 | Own | H01J 37/1471 |
| 10,847,343 B1* | 11/2020 | Own | C23C 14/52 |
| 2003/0132383 A1 | 7/2003 | Benner | |
| 2007/0284528 A1 | 12/2007 | Benner et al. | |
| 2009/0108200 A1* | 4/2009 | Wang | H01J 37/09 |
| | | | 250/311 |
| 2009/0166558 A1 | 7/2009 | Nagayama | |
| 2010/0181481 A1 | 7/2010 | Benner et al. | |
| 2011/0233403 A1 | 9/2011 | Own et al. | |
| 2012/0049062 A1 | 3/2012 | Benner et al. | |
| 2013/0126729 A1* | 5/2013 | Own | H01J 37/261 |
| | | | 250/311 |
| 2013/0163076 A1* | 6/2013 | Nagaoki | H01J 37/26 |
| | | | 359/370 |
| 2013/0284925 A1* | 10/2013 | Tanigaki | H01J 37/22 |
| | | | 250/311 |
| 2013/0292566 A1* | 11/2013 | Benner | H01J 37/244 |
| | | | 250/311 |
| 2014/0145089 A1* | 5/2014 | Wang | H01J 37/09 |
| | | | 250/396 ML |
| 2015/0243474 A1* | 8/2015 | Lazic | H01J 37/28 |
| | | | 250/311 |
| 2016/0196952 A1 | 7/2016 | Matsumoto et al. | |
| 2018/0076005 A1* | 3/2018 | Haas | G01R 33/02 |
| 2019/0131107 A1* | 5/2019 | Tamaki | H01J 37/226 |
| 2019/0287759 A1* | 9/2019 | Own | H01J 37/20 |
| 2020/0303152 A1* | 9/2020 | Ohshima | H01J 37/073 |
| 2021/0233741 A1* | 7/2021 | Harada | G01N 23/201 |

FOREIGN PATENT DOCUMENTS

| | | |
|---|---|---|
| JP | 2012199022 A | 10/2012 |
| JP | 2014049444 A | 3/2014 |
| JP | 2016162532 A | 9/2016 |
| WO | 2007058182 A1 | 5/2007 |
| WO | 2015045476 A1 | 4/2015 |
| WO | 2018037444 A1 | 3/2018 |

OTHER PUBLICATIONS

Y. Taniguchi, et al., "Foucault imaging by using non-dedicated transmission electron microscope", Appl. Phys. Lett. 101, 2012, pp. 1-5.

Settles, G.S.; Schlieren and Shadowgraph Techniques; Chapter 2, Springer, 2001, pp. 26-37.

Nagayama, Kuniaki; Complex Observation in Electron Microscopy: V. Phase Retrieval for Strong Objects with Foucault Knife-Edge Scanning; Journal of the Physical Society of Japan; vol. 73; No. 10; Oct. 15, 2004; pp. 2725-2731.

Search Report dated Oct. 21, 2019 in corresponding International Application No. PCT/JP2019/029360.

Written Opinion dated Oct. 21, 2019 in corresponding International Application No. PCT/JP2019/029360.

Search Report dated Mar. 25, 2022 in European Application No. 19840992.2.

Doole et al. "Improved Foucault Imaging of Magnetic Domains With a Modified 400 Kv Transmission Electron Microscope", Review of Scientific Instruments, American Institute of Physics, vol. 64, No. 4, Apr. 1993, pp. 1038-1043.

Harada et al. "Hollow-Cone Foucault Imaging Method", Applied Physics Express, vol. 12, No. 4, Mar. 2019, p. 1-4.

T. Hirayama et al. "Observation of Magnetic-Domain States of Barium Ferrite Particles by Electron Holography", Applied Physics Letters, American Institute of Physics, vol. 63, No. 3, Jul. 1993, pp. 418-420.

Kunath et al. "Apodization in Phase-Contrast Electron Microscopy Realized With Hollow-Cone Illumination", UL Tramicroscopy, vol. 16, No. 2, Jan. 1985, pp. 123-138.

* cited by examiner

MULTI-WAVE IMAGING
(BRIGHT FIELD IMAGE)

SINGLE WAVE IMAGING
(BRIGHT FIELD IMAGE)

DARK FIELD IMAGE

SCHLIEREN IMAGE

MULTI-WAVE IMAGING
(BRIGHT FIELD IMAGE)

ASYMMETRIC IMAGING
(BRIGHT FIELD IMAGE)

SCHLIEREN IMAGE

DARK FIELD IMAGE

FIG. 7
FIG. 7A
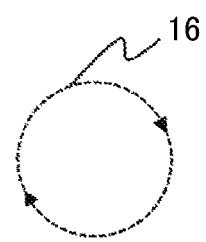
FIG. 7B
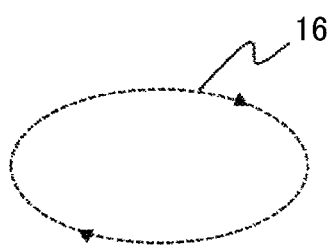
FIG. 7C
FIG. 7D
FIG. 7E

16    56

FIG. 14A
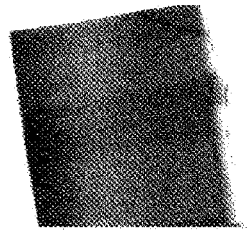
BRIGHT FIELD IMAGE
BRIGHT FIELD HOLLOW-CONE FOUCAULT IMAGE
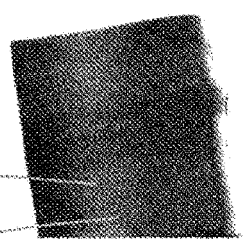
91
92 FIG. 14B
FIG. 14C
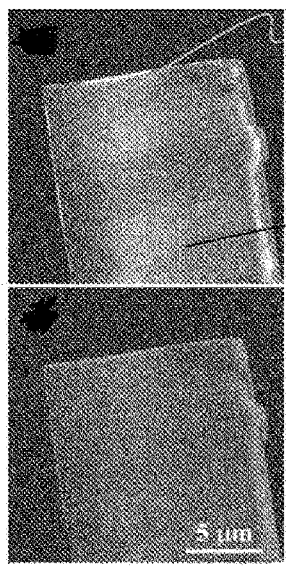
91
DARK FIELD HOLLOW-CONE FOUCAULT IMAGE
92
DARK FIELD IMAGE
FIG. 14D
FIG. 15A    FIG. 15B    FIG. 15C
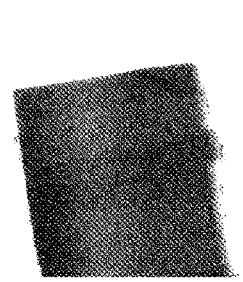 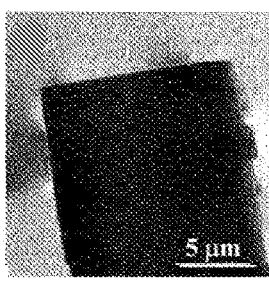 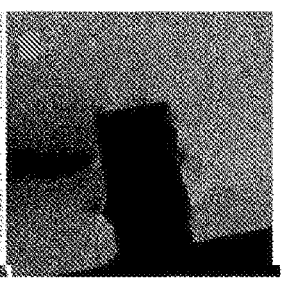
SCHLIEREN IMAGE (IN-SAMPLE DISPLAY)   SCHLIEREN IMAGE (BACKGROUND DISPLAY)   SCHLIEREN IMAGE (BACKGROUND DISPLAY)

ELECTRON MICROSCOPE AND SAMPLE OBSERVATION METHOD USING THE SAME

TECHNICAL FIELD

The present invention relates to an electron microscope and a sample observation method using the electron microscope.

BACKGROUND ART

In a general-purpose transmission electron microscope, a material mainly containing a light element such as biological samples and organic materials is a weak scatterer for electron waves and has been known as a material that is difficult to observe with a sufficient contrast. In addition, even if the material is a metal or semiconductor sample, an electromagnetic structure such as a magnetization distribution of the magnetic material and a polarization structure of a dielectric is a weak phase object that gives a small deflection only to a phase of an electron wave. Although several methods such as a phase contrast microscopy using an electron holography or a phase plate and a differentiation phase contrast method using a scanning a transmission microscope have been developed, each method has been required to use a specific additional device and therefore has not been widely used. Under the above circumstances, a Lorenz microscopy developed as a method for observing a magnetic material, especially, a Fresnel method is the simplest and has widely been used as a method for observing the weak scatterers and the phase objects.

As related prior art documents, there are PTL 1 to 4, NPTL 1 and 2, and so on.

CITATION LIST

Patent Literature

PTL 1: Japanese Patent Application Laid-Open No. 2012-199022
PTL 2: International Publication No. WO2015/045476
PTL 3: Japanese Patent Application Laid-Open No. 2016-162532
PTL 4: International Publication No. WO2018/037444

Non-Patent Literature

NPTL 1: N. Chapman, J. Phys. D: Appl. Phys. 17, (1984) 623.
NPTL 2: Y. Taniguchi, H. Matsumoto and K. Harada, Appl. Phys. Lett. 101, (2012) 093101.

SUMMARY OF INVENTION

Technical Problem

The magnetization distribution of the magnetic material and polarization structure of the dielectric material described above are important structures that determine a nature of the material, but is a weak phase object that gives a small deflection only to the phase of the electron wave. Therefore, only a limited number of observation methods have been realized in the present circumstances. As a method for observing the electromagnetic structure of those electromagnetic materials with the transmission electron microscope, the Lorenz microscopy has been mainly used. The Lorenz method is roughly classified into a Fresnel method that defocuses a sample image and visualizes a domain boundary of the electromagnetic structure, and a Foucault method that shields a part of the deflected electron beam by an aperture opening (hole) of an optical system to cause the part of electron beam not to contribute to the imaging, thereby obtaining the contrast of the electromagnetic structure. Those methods have drawbacks such that a high spatial resolution is not obtained in order to perform defocusing (Fresnel method), and that asymmetric imaging is formed with respect to an optical axis due to the position of the aperture hole of the optical system, and an orientation dependency occurs in which an orientation along which the electromagnetic structure can be observed and an orientation along which the electromagnetic structure cannot be observed (Foucault method). Further, in both of those methods, the spatial resolution of the observation image is limited since defocusing is performed (Fresnel method), and a small angle aperture is used (Foucault method). In addition, in the Lorentz method, the electromagnetic field in space cannot be almost observed since the contrast is not obtained.

An object of the present invention is to solve the above-mentioned problems and to provide an electron microscope and a sample observation method using the electron microscope, which are capable of obtaining an observation image of a weak scatterer or a phase object with in-focus, high resolution, and no orientation dependency.

Solution to be Problem

In order to achieve the above object, according to the present invention, there is provided an electron microscope that includes a source of an electron beam; an irradiation lens system including at least two electron lenses for irradiating a sample with the electron beam emitted from the source; a sample holding device for holding the sample irradiated with the electron beam; an objective lens system for forming an image of the sample; an aperture device that is disposed downstream of the sample holding device in a travel direction of the electron beam; an imaging lens system that is disposed downstream of the aperture device in the travel direction of the electron beam; an observation plane that observes the image of the sample by the imaging lens system or a diffraction pattern of the sample; a recording device for recording the image of the sample or the diffraction pattern of the sample; and at least two stages of electron beam deflectors that are disposed between the source of the electron beam and the sample holding device, in which the image of the source of the electron beam is formed on a plane of the aperture plate of the aperture device, and the irradiation of the sample with the electron beam is orbited in all azimuth angles around the optical axis while an irradiation angle to the sample is kept within a predetermined range by adjusting a deflection action of each of the two stages of electron beam deflectors.

Further, in order to achieve the above object, according to the present invention, there is provided a sample observation method using an electron microscope that includes a source of an electron beam; an irradiation lens system including at least two electron lenses for irradiating a sample with the electron beam emitted from the source; a sample holding device for holding the sample irradiated with the electron beam; an objective lens system for forming an image of the sample; an aperture device that is disposed downstream of the sample holding device in a travel direction of the electron beam; an imaging lens system that is disposed downstream of the aperture device in the travel direction of the electron beam; an observation plane that observes the image of the sample by the imaging lens system or a diffraction pattern of the sample; a recording device for recording the image of the sample or the diffraction pattern of the sample; and at least two stages of electron beam deflectors that are disposed between the source of the electron beam and the sample holding device, the method including: forming the image of the source of the electron beam on a plane of the aperture plate of the aperture device; and orbiting the irradiation of the sample with the electron beam in all azimuth angles around the optical axis while an irradiation angle to the sample is kept within a predetermined range by adjusting a deflection action of each of the two stages of electron beam deflectors to obtain the image of the sample.

Advantageous Effects of Invention

According to the present invention, the electromagnetic structure of the samples, and further biological samples and organic materials can be observed with high resolution and in focus.

BRIEF DESCRIPTION OF DRAWINGS

FIGS. 7A-7E are diagrams showing examples of a trajectory of a zero(0th)-order diffraction pattern observed on an aperture plate plane according to Example 1.

FIGS. 14A-14D are diagrams showing examples of various experimental results according to Example 9.

FIGS. 15A-15C are diagrams showing examples of a Schlieren method according to Example 9.

DESCRIPTION OF EMBODIMENTS

Figure 1A:
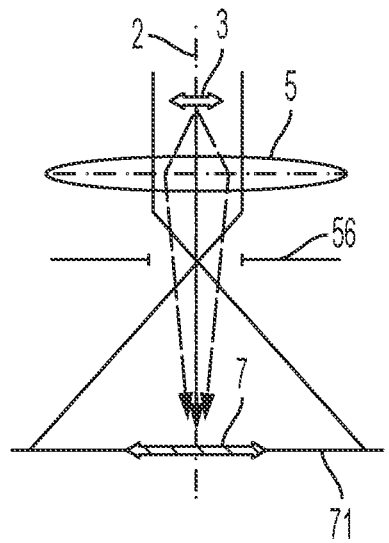
FIGS. 1A-1D are schematic diagrams of an optical system that obtains various images using an electron beam parallel to an optical axis with an electron microscope.
Figure 1B:
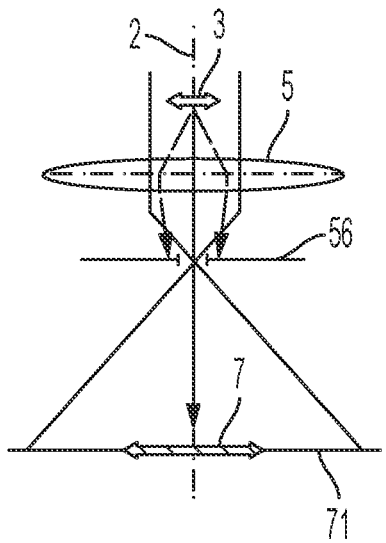

In describing embodiments for carrying out the present invention, an observation method of a transmission electron microscope used at present will be described with reference to FIGS. 1A-1D and 2A-2D. FIGS. 1A and 1B shows a case where a sample is irradiated with an electron beam parallel to an optical axis of the electron microscope, and FIGS. 2A-2D show a case where the sample is irradiated with an electron beam inclined with respect to the optical axis assuming a configuration of the present invention. The case where an incident electron beam shown in FIGS. 1A-1D is incident parallel to the optical axis is the most general observation method, and a method in which the electron beam is inclined and incident to the optical axis shown in FIGS. 2A-2D is an inclination method. In a hollow-cone of the present invention, the inclination method is main used, but for facilitation of understanding the inclination method, both of those methods will be described together.

In the present specification, an electron microscope most developed as a charged particle beam device equipped with an imaging optical system will be described in mind, but the present invention is not limited to the electron microscope. In addition, in the present specification, both terms "electron wave" and "electron beam" are used together. In principle, when discussing based on a phase, the term "electron wave" is used, when discussing geometrical optics propagation trajectory/path, the term "electron beam" is used. Furthermore, in the present specification, the expression of "while keeping the irradiation angle of the sample within a predetermined range" means that the inclination angle of the irradiated electron beam may be changed within a predetermined range, or the irradiation angle may be kept constant.

<Bright Field Imaging Method>

The bright field imaging method is the most common observation method in a transmission electron microscope that magnifies and records the electron beam that has passed through a sample directly with an objective lens. FIGS. 1A and 1B, and FIGS. 2A and 2B show an optical system of the bright field imaging method. The optical system irradiates the sample with parallel electron beams, and selects and images only electron beams that propagate in the vicinity of a direction of the incident electron beam among the electron beams scattered, diffracted, and deflected by the sample by an objective aperture.

A weak amplitude object that is transparent to electron waves, that is, has an amplitude transmittance of approximately 1 is hardly directly observed, but a hole with a small aperture is selected for the objective aperture directly below the objective lens to limit the electron beams to those that propagate in the very vicinity of the optical axis, thereby making it possible to obtain a contrast with some degree. However, in the case of the weak amplitude objects such as biological samples and organic samples, in order to obtain an appropriate contrast, there is a need to stain the sample. Even in the case of the weak amplitude object as described above, a phase of the electron wave that has passed through the sample is relatively largely modulated, and an observing method using a phenomenon such as phenomena such as refraction, deflection, and interference has been developed.

<Dark Field Imaging Method>

Figure 1C:
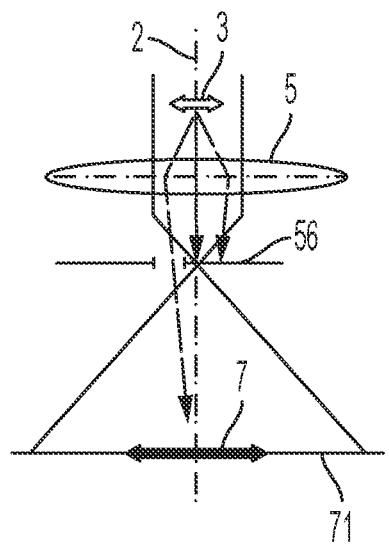
Figure 1D:
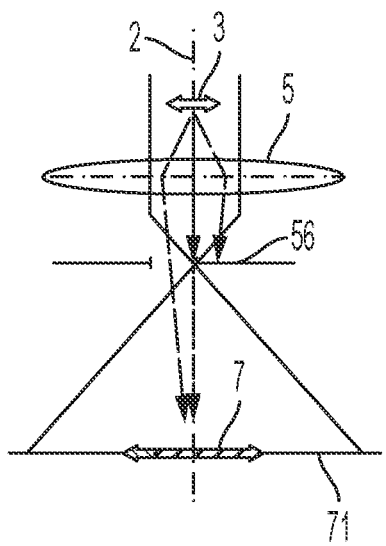
Figure 2A:
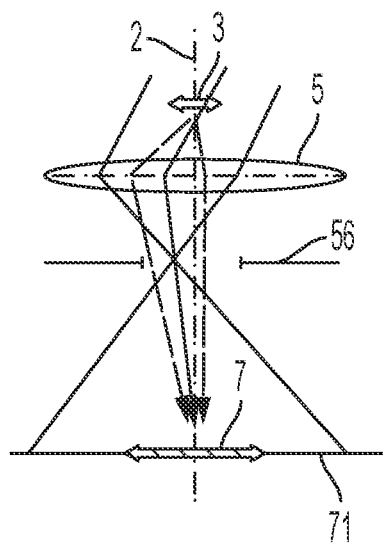
FIGS. 2A-2D are schematic diagrams of the optical system that obtains various images using an incident electron beam that is inclined with the optical axis with the electron microscope.
Figure 2B:
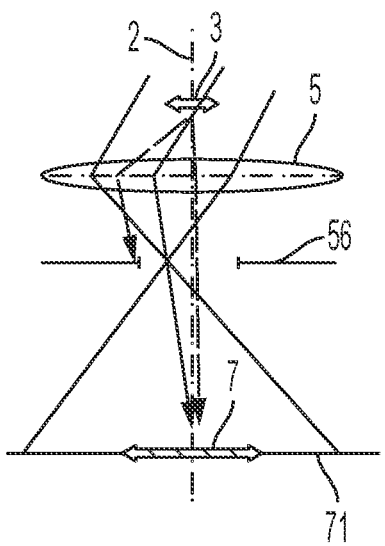
Figure 2C:
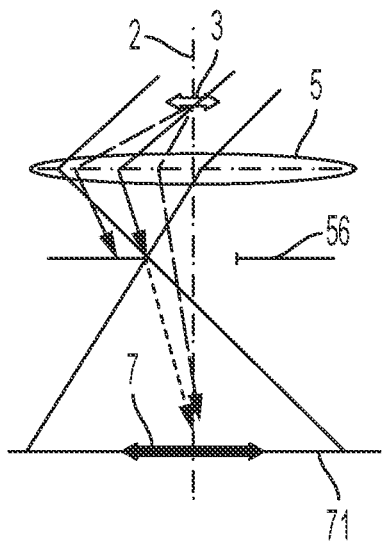

The dark field imaging method is a method of observing a sample not using the direct electron waves transmitted through the sample for imaging, but using only electron waves scattered, deflected, and diffracted by the sample. FIGS. 1C and 2C show an optical system. When the sample is irradiated with an electron wave propagating parallel to an optical axis on the optical axis of the illumination optical system as shown in FIGS. 1A-1D, imaging is realized by only waves scattered, deflected, and diffracted by the sample by removing an objective aperture from the optical axis. Imaging is limited to an orientation in which the objective aperture is off the optical axis, and the image is orientation dependency. For identification of stacking faults, a dark field imaging method is used to identify the type of stacking fault by imaging with only a specific diffracted wave. The dark field imaging method in which an incident electron wave to the sample is inclined in advance in an appropriate orientation and direction for reducing an influence of aberrations to obtain an appropriate image is an optical system shown in FIG. 2C.

In the optical microscope, there is used a method for forming a dark field image having information on all azimuth angles in which an annular ring aperture is used for an irradiation (condenser) lens devised to obtain a large irradiation angle so that the sample can be irradiated with only a light that is off the optical axis of the irradiation optical system, and a circular opening of a small size which filters a direct wave that has passed through the sample is used for an aperture diameter of the objective aperture. The sample irradiation method using the annular ring aperture is called hollow-cone illumination, which is an illumination method used in a phase contrast microscope and a Schlieren microscope. In the dark field method, since a direct transmitted wave is filtered, waves that have been scattered, deflected, or diffracted by the sample are imaged and there is an advantage that a sample image can be observed with high contrast. On the other hand, because the sample image is extremely dark, an exposure time should be long, and an SN ratio is basically small and the dark field method is not suitable for dynamic observation.

<Phase Difference Observation Method>

The phase difference observation method is a method in which an image of a sample is formed with high contrast as a result of interference of a transmitted wave with a diffracted wave by aligning or inverting phases of the transmitted wave and the diffracted wave by shifting only the phase of the transmitted wave by $\pi/2$. The observation method using a phase plate ($\lambda/4$ plate) of the Zernike-type is an excellent method in which the contrast and the amount of phase modulation have a linear relationship in the case of a weak phase object which is small in a phase modulation given to the transmitted wave by the sample. The above observation method is so popular that the phase difference method generally called points to the method using the phase plate of Zernike-type.

In the optical microscope, a configuration in which the sample is irradiated using the annular ring aperture described in the dark field method (hollow-cone illumination), and further a ring-shaped phase plate that gives a phase difference of $\pm\pi/2$ to only the transmitted wave is also used in the objective lens is general. In the electron microscope, a phase plate system is used which phase modulates only a transmission spot of a diffraction pattern, or phase modulates portions other than the transmission spot by using the bright field optical system. In other words, a method of using a carbon thin film having a minute opening or a micro-opening electrode, or a hole-free phase plate using at an objective aperture position (diffraction space) is tried (not shown). However, in all the methods, since an influence of charge-up of the phase plate by the electron beam irradiation appears strongly, those methods have not become popular.

<Schlieren Imaging Method>

Figure 2D:
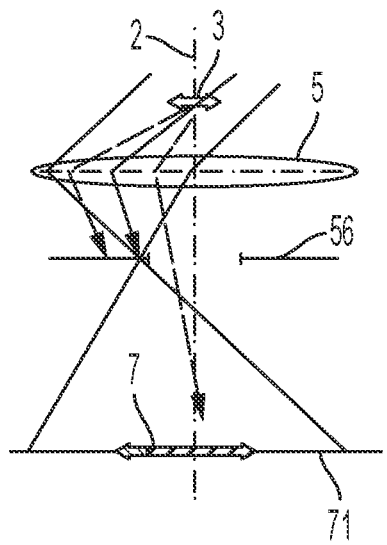

The Schlieren imaging method is an intermediate method between the bright field imaging method and the dark field imaging method from the viewpoint of how to use the device. FIGS. 1D and 2D show an optical system. The Schlieren method is a method (one-dimensional Schlieren method) in which a knife edge is prepared in a diffraction space and a transmitted wave and a diffracted wave are filtered together by half. Since an image is formed by only waves having an angle which have not been filtered, in the one-dimensional Schlieren method, an image in which only one side of an observation target (sample) is brightly emphasized, for example, such as a bird's-eye view of a cityscape illuminated by the setting sun is obtained. In order to obtain an omnidirectional emphasized image, an annular ring aperture is used in the irradiation system as in the dark field imaging method, a circular opening is used in the objective aperture, and half of the transmitted wave is adjusted to be filtered just in the circular opening of the objective aperture. As a result, an image with contour enhancement over all azimuth angles of the sample (omni-azimuthal Schlieren image) is obtained. However, the obtained contrast and phase difference are non-linear and qualitative, and only the observation image can be realized.

In the Schlieren imaging method, transmitted waves can be used unlike the dark field imaging method so that high-speed photography is enabled. The Schlieren method is used only as an observation method taking the advantage of the feature that the image can be brightly observed, such as a dynamic observation of the density distribution of air that can be created on a candle flame, and visualization of shock waves around a high-speed projectile such as a bullet.

<Hollow-Cone Illumination>

The hollow-cone illumination is an inclined illumination performed on the optical axis over all azimuth angles. The hollow-cone illumination is an illumination method in which an annular ring aperture is disposed in the irradiation optical system, and the sample is illuminated only with a beam inclined with respect to the optical axis, which is an illumination method used in the phase difference method and the Schlieren method (omni-azimuthal type). In the optical microscope, the annular ring aperture is used for the irradiation lens devised to obtain a large irradiation angle, so that the sample is irradiated in all azimuth angles at an inclined angle.

Figure 3:
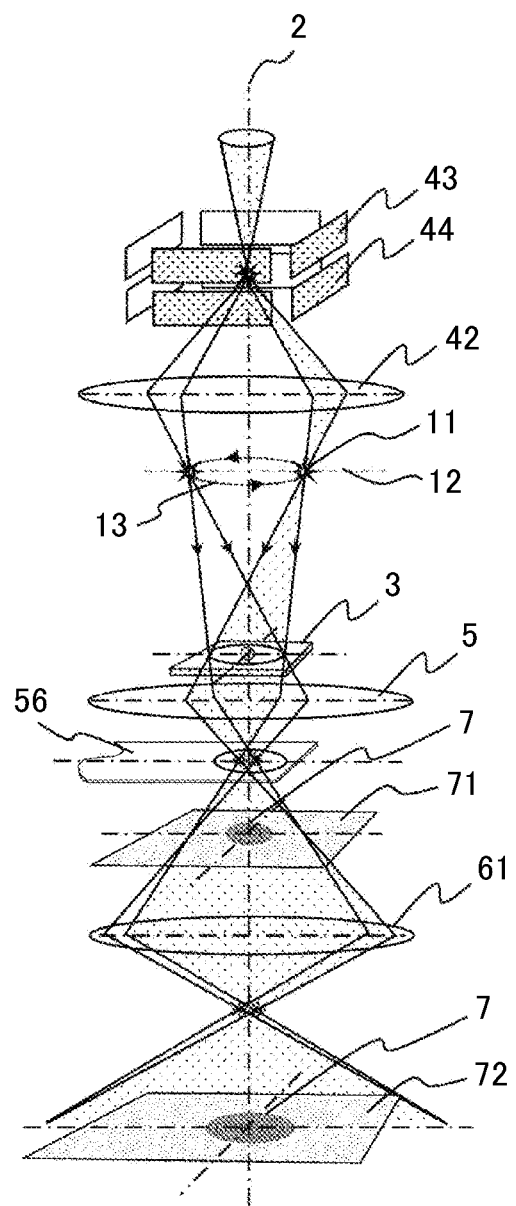
FIG. 3 is a schematic diagram of an optical system of a hollow-cone illumination method by the electron microscope.

On the other hand, it is difficult to realize the annular ring aperture in the electron microscope. There is no means for fixing a disk that determines an inner diameter in a hollow, and there is an example in which the inner disk is fixed by about three crosslinks. However, since this example has a drawback that the scattering of electron waves due to cross-linking causes noise, as shown in FIG. 3, orbiting deflection illumination is frequently implemented on the optical axis 2 by using the two-stage deflection systems 43 and 44 of the irradiation optical system. There is a difference in the presence or absence of interference effect between the hollow-cone illumination with orbiting deflection using the deflection system and the hollow-corn illumination with an annular ring aperture. Since the hollow-corn illumination by orbiting deflection using the deflection systems 43 and 44 is illumination from one orientation, no interference with the illumination wave from the other azimuth occurs. On the other hand, in the hollow-corn illumination using the annular ring aperture, since the illumination waves from all the azimuths exist at the same time, the effects of interference with each other are reflected. However, the hollow-corn illumination is a method for reflecting the effects of diffraction and deflection in contrast, and there is almost no usage that the effect of interference affects. For that reason, both of the hollow-cone illumination methods for the optical microscope and the electron microscope are frequently treated as the same methods, and in the electron microscope, the configuration shown in FIG. 3 is called the hollow-cone illumination method.

<Small Angle Electron Diffraction>

In the general transmission electron microscopy, the diffraction pattern formed on a back focal plane (strictly speaking, an image plane of an electron source by an objective lens) of the objective lens on which an image 7 of the image is formed can be observed. When the sample is a crystalline material, a Bragg diffraction by crystal is observed, and stacking faults and dislocations in the crystal sample described above are observed based on the observed pattern. On the other hand, in the case of magnetic materials, dielectric materials, and so on that the present application keeps in mind, an orientation/direction of deflection received when an incident electron wave passes through each magnetic domain and dielectric polarization region, and a diffraction pattern (deflection pattern) corresponding to a magnitude of the deflection can be obtained. The amount of deflection is smaller than Bragg diffraction by 2 to 4 orders, which is about $10^{-4}$ to $10^{-6}$ rad, and a small-angle diffraction optical system is often constructed and observed specially.

Figure 4A:
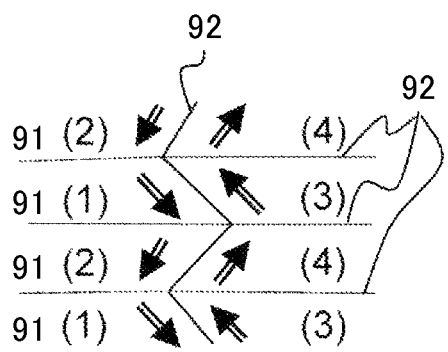
FIGS. 4A and 4B are schematic diagrams showing a 90°/180° magnetic domain structure and an electron diffraction pattern.
Figure 4B:
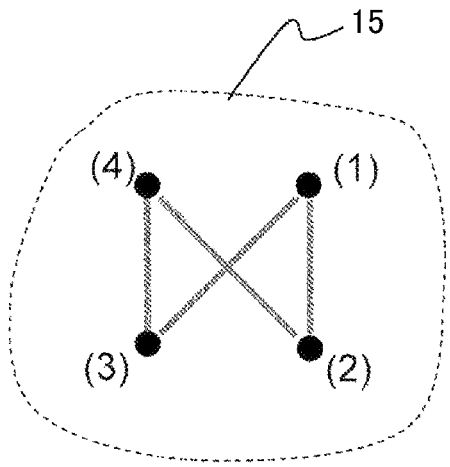

FIGS. 4A-4B show schematic diagrams of a 90°/180° magnetic domain structure frequently observed in permalloy and LSMO (lanthanum, strontium, manganese oxide) and a diffraction pattern of the structure. In FIG. 4A, magnetization directions of magnetic domains indicated in (1) to (4) are indicated by arrows. A boundary of each magnetic domain is assumed to be a Bloch type domain wall, which is indicated by a streak between respective diffraction (deflection) spots indicated by (1) to (4) shown in FIG. 4B.

When a vacuum portion without a sample or a magnetic region is included in an irradiation region, a 0 th-order diffraction spot is generated in the diffraction pattern, but in an example of FIG. 4B, since the entire region irradiated with the electron beam is included in the magnetic domain structure, no 0th-order diffraction spot is generated. The intersection of orthogonal streaks from the 180° domain wall coincides with the optical axis of the optical system.

Figures 5A, 5B:
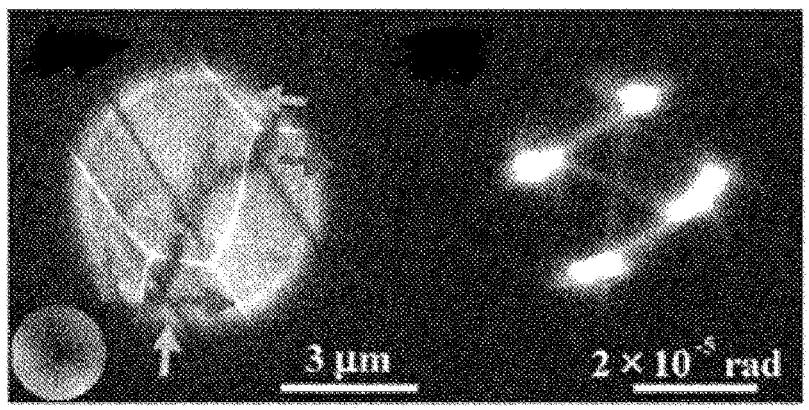
FIGS. 5A and 5B are diagrams showing an example of an experimental result of a 90°/180° magnetic domain structure and a small-angle electron diffraction pattern.

FIGS. 5A and 5B show experimental results disclosed by the present inventors as FIGS. 4A and 4B of NPTL 2. FIG. 5A shows the observation results (Fresnel image) by the Fresnel method of the 90°/180° magnetic domain structure, and FIG. 5B shows a small-angle diffraction pattern. Four spots in FIG. 5B are a diffraction pattern of the electron beam deflected from each 90° magnetic domain. A straight line between the respective spots is a diffraction wave from the domain wall of each magnetic domain, and a straight streak indicates that the domain wall is a Bloch type. It can be seen that the deflection angle to the electron beam is about $10^{-5}$ rad.

Example 1

Example 1 is an example of an electron microscope for observing a sample using hollow-corn illumination, and a sample observation method using the electron microscope. That is, Example 1 is an example of an electron microscope including: a source of an electron beam; an irradiation lens system including at least two electron lenses for irradiating a sample with the electron beam emitted from the source; a sample holding device for holding the sample irradiated with the electron beam; an objective lens system for forming an image of the sample; an aperture device that is disposed downstream of the sample holding device in a travel direction of the electron beam; an imaging lens system that is disposed downstream of the aperture device in the travel direction of the electron beam; an observation plane that observes the image of the sample by the imaging lens system or a diffraction pattern of the sample; a recording device for recording the image of the sample or the diffraction pattern of the sample; and at least two stages of electron beam deflectors that are disposed between the source of the electron beam and the sample holding device, in which the image of the source of the electron beam is formed on the aperture plate plane of the aperture device, an irradiation angle to the sample is changed by adjusting a deflection action of each stage of two-stage electron beam deflectors, and the irradiation of the sample with the electron beam changes within a predetermined range of inclined angle while being orbited in all azimuth angles around the optical axis.

Further, Example 1 is an example of a sample observation method using an electron microscope including: a source of an electron beam; an irradiation lens system including at least two electron lenses for irradiating a sample with the electron beam emitted from the source; a sample holding device for holding the sample irradiated with the electron beam; an objective lens system for forming an image of the sample; an aperture device that is disposed downstream of the sample holding device in a travel direction of the electron beam; an imaging lens system that is disposed downstream of the aperture device in the travel direction of the electron beam; an observation plane that observes the image of the sample by the imaging lens system or a diffraction pattern of the sample; a recording device for recording the image of the sample by the imaging lens system or the diffraction pattern of the sample; and at least two stages of electron beam deflectors that are disposed between the source of the electron beam and the sample holding device, the method including: forming the image of the source of the electron beam on a plane of the aperture plate of the aperture device; changing the irradiation angle to the sample by adjusting the deflection action of each stage of the two-stage electron beam deflectors; and adjusting the irradiation of the sample with the electron beam so as to change at a predetermined inclined angle while being orbited in all azimuth orientation angles around the optical axis to obtain the image of the sample.

Figure 6:
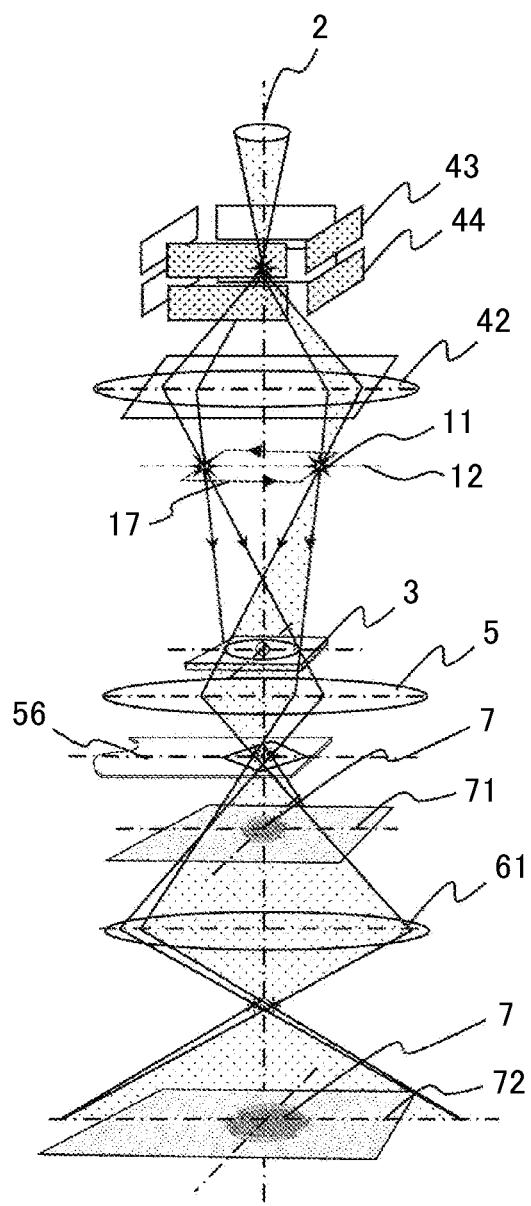
FIG. 6 is a schematic diagram of an electron optical system showing a sample observation method using a hollow-cone illumination according to Example 1.

FIG. 6 shows a schematic diagram of the electron optical system of the electron microscope according to the present example. As is apparent from FIG. 6, components of the electron optical system of the electron microscope according to the present example are basically the same as the electron optical system for realizing the hollow-cone illumination method with the electron microscope shown in FIG. 3. The sample is irradiated with the electron beam emitted from the source and accelerated at a predetermined voltage at a predetermined angle to an optical axis 2 of the illumination optical system of the electron microscope by at least two-stage electron beam deflectors 43 and 44 provided in the irradiation lens system. The irradiation angle can be deflected by using the deflectors 43 and 44 without changing an irradiation area.

In FIG. 6, a crossover trajectory 17 of crossover of a crossover plane 12 is shown by a square, which shows an example in which the optical axis 2 and the irradiation angle change by two cycles while the irradiation of the sample with the electron beam is orbited in all azimuth angles around the optical axis. When the azimuth angle is continuously changed around the optical axis 2 of the irradiation angle while the optical axis 2 of the optical system and the irradiation angle are held at a predetermined angle, as in FIG. 3, the trajectory of the crossover of the crossover plane 12 is circular (reference numeral 13 in FIG. 3).

An aperture plate 56 having a predetermined shape is provided on a diffraction plane (image plane of the source) of the sample by the objective lens 5. When an $0^{th}$-order diffraction spot is orbited inside of the opening (hole) of the aperture plate 56, a bright field image is observed as a final image plane, and when the $0^{th}$-order spot is shielded and only the scattered waves are orbited in the opening, a dark field image is observed as the final image plane. An exposure time for recording the final image has a predetermined relationship with an orbiting time over all azimuth angles of the inclined angle to the optical axis of the irradiation electron beam, the bright field image or the dark field image responsible for information from all orientations not depending on the orientation angle can be obtained in the observation image. When the bright field image/dark field image reflects an electromagnetic structure of the sample, the bright field image/dark field image corresponds to the Foucault image.

When only the optical axis 2 and the irradiation angle of the electron beam are deflected without changing the irradiation area on the sample, if the observation of the sample is in-focus, the deflection of the irradiation angle is not detected by only the observation of the sample plane. However, if the diffraction plane is observed, as shown in FIGS. 7A-7E, the movement of the diffraction pattern is observed and detected as the trajectory 16 of the diffraction pattern. For example, when the azimuth angle around the optical axis of the irradiation angle is continuously changed while the optical axis 2 of the irradiation optical system and the irradiation angle are kept at a predetermined angle, as shown in FIG. 7A, a state in which the trajectory 16 of the diffraction pattern from the sample 3 is orbited in a circle is observed.

As shown in FIG. 3, when the azimuth angle around the optical axis of the irradiation angle is continuously changed while the optical axis of the optical system and the irradiation angle are kept at a predetermined angle, the $0^{th}$-order spot of the diffraction pattern is orbited in a circle. However, when the trajectory 16 is orbited in all azimuth angles while the inclination angle to the optical axis of the optical system and the azimuth angle of the irradiation are changed with a predetermined relationship, the diffraction pattern can be drawn with any shape.

For example, in FIG. 7B, when the inclination angle is continuously increased in two target directions across the optical axis (horizontal direction in FIG. 7B), the trajectory 16 drawn by the $0^{th}$-order spot of the diffraction pattern is a horizontally long ellipse. Also, when the inclination angle is changed symmetrically three times with respect to the optical axis, as shown in FIG. 7C, the trajectory drawn by the $0^{th}$-order spot of the diffraction pattern can be drawn in equilateral triangle. When the inclination angle is changed symmetrically four times as shown in FIG. 6, the trajectory can be drawn in square. Further, as shown in FIG. 7E, a horizontal hexagonal trajectory can be drawn in the $0^{th}$-order diffraction pattern. In FIGS. 7A-7E, the orbit of the $0^{th}$-order diffraction pattern is drawn clockwise, but the same is entirely applied to counterclockwise, and this method does not depend on the rotating direction of orbit.

Figure 8A:
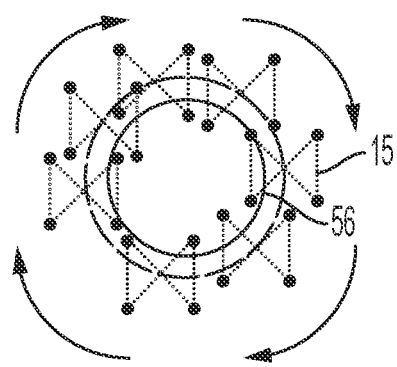
FIGS. 8A-8C are diagrams illustrating a relationship between the opening of the aperture plate and the zero(0th)-order diffraction pattern according to Example 1.
Figure 8B:
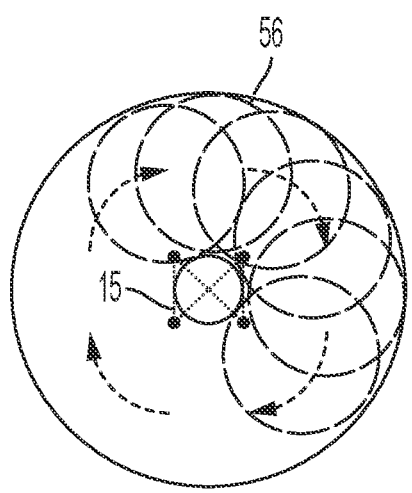
Figure 8C:
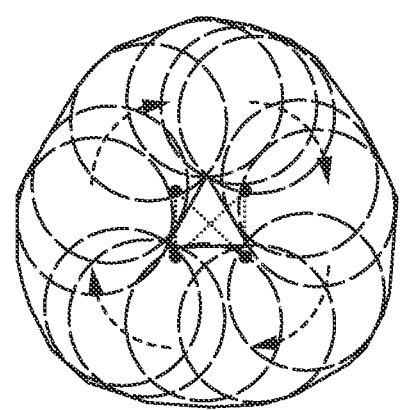

FIGS. 8A-8C show relationships of the diffraction pattern at the time of the hollow-cone illumination and the opening of the aperture plate 56 of the objective according to the present example. FIG. 8A is a schematic diagram illustrating that the diffraction pattern 15 orbits in circle around a circular opening (hole). FIG. 8B is a schematic diagram illustrating that the circular opening orbits in circle around the diffraction pattern 15 in relatively the same manner as FIG. 8A. FIG. 8C is a schematic diagram illustrating that the circular opening orbits around the diffraction pattern so as to draw triangle. FIG. 8A draws a state in which a diffraction (deflection) pattern 15 of a 90°/180° magnetic domain structure illustrated in FIG. 4B orbits the periphery of the circular opening of the aperture plate 56. The intersections of the orthogonal streaks from the 180° domain wall coincides with the optical axis (position of the $0^{th}$-order diffraction spot) of the optical system. That is, FIG. 8A shows an example in the dark field image.

Diffraction spots and streaks that pass through the aperture opening as the diffraction pattern orbits in all orientations change, and as shown in FIG. 8A, the diffraction spots and the streaks pass through the aperture opening once for each round of the diffraction pattern 15. A relative relationship of the diffraction pattern and the aperture opening is shown in FIG. 8B when the diffraction pattern is stopped and drawn as immobile. That is, the aperture opening orbits around the diffraction pattern 15. In FIG. 8C, a case where the trajectory of the orbit of the 0th-order diffraction pattern around the circular aperture opening is triangular is drawn centering on the circular aperture opening. The relationship between FIGS. 8A and 8B is equivalent, and the difference is only in drawing. To study the range and spatial resolution of diffraction patterns that contribute to imaging, the expression of FIG. 8B is easier to understand. For example, it is understood from FIG. 8B that a spatial frequency equivalent to that when the annular ring aperture is used for the diffraction pattern is used for imaging.

At that time, since the diameter of the opening diameter corresponds to the width of the ring, it is understood that, in principle, a spatial resolution that is about twice as high as the conventional bright field/dark field method. In the effective annular ring aperture plate, the inner diameter is determined according to the inclination angle of an incident electron beam to the optical axis, and the outer shape is determined according to a diameter of the aperture opening. Since there is no limit to the outside of the diffraction pattern, if a large-sized opening is used, the bright field/dark field image (Foucault image) with a high resolution can be obtained.

Note that the trajectories of those $0^{th}$-order diffraction patterns are only examples. According to the configuration of the present example, a predetermined deflection region (for example, magnetic domain) gives contrast to the deflection region boundary (for example, domain wall) by drawing a shape matching the shape of the diffraction pattern of the observation target, and the observation target can be observed in-focus in the sample image.

Example 2

Example 2 relates to a preferred configuration of a pole piece of an objective lens of the electron microscopes described with reference to FIGS. 3 and 6 when observing a magnetic material. That is, in this example, one of the electron lenses configuring the objective lens system of the electron microscope in FIGS. 3 and 6 is a non-magnetic lens for the sample.

Figure 9A:
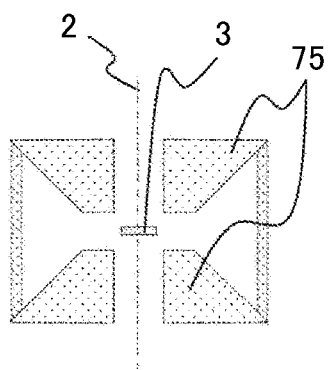
FIGS. 9A-9C are schematic diagrams showing an example of an objective lens pole piece without applying a magnetic field to the sample according to Example 2.
Figure 9B:
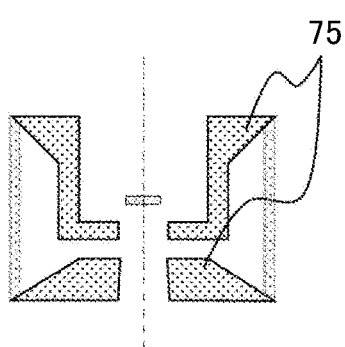
Figure 9C:
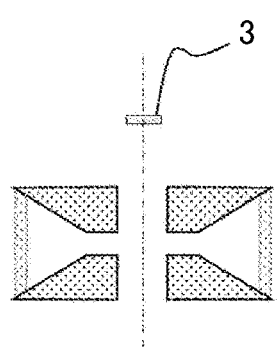

FIGS. 9A-9C show a relationship between a sample 3 and a pole piece 7 of an objective lens 5 when observing the magnetic material. FIG. 9A shows a schematic diagram when a normal objective lens is turned off. FIG. 9B shows a schematic diagram when a non-magnetic lens is used, and FIG. 9C shows a schematic diagram when a sample is largely removed from a lens magnetic path.

In the normal objective lens, a strong magnetic field is used to reduce a spherical aberration coefficient of the electron lens, and the sample is immersed in the magnetic field of the objective lens in order to observe a high-resolution image. However, when the magnetic material is to be observed, in order to avoid an influence of the magnetic field applied on the sample, the objective lens is turned off as shown in FIG. 9A, or a non-magnetic lens is used as shown in FIG. 9B. Alternatively, as shown in FIG. 9C, special experimental conditions such as being sufficiently separated from the magnetic path of the objective lens are met.

In FIG. 9A, lens pole pieces 75 are drawn with a broken line indicating that no magnetic field is applied. In that case, the sample is first imaged by using a first stage lens, such as an objective mini lens of a lower portion of the objective lens or a magnifying lens, below the objective lens. However, in the optical system of the electron microscope shown in FIGS. 3 and 6, it is essential to converge the electron beam on the aperture plate plane below the objective lens, in other words, to form the image of the source of the electron beam on the aperture plate plane of the aperture device. In order to form the image 7 of the sample on the observation/recording plane, there is also a need to use the lenses of the second and subsequent stages. Further, in order to converge the electron beam on the aperture plate plane, the configuration including the irradiation optical system can be also used. However, in that case, since the adjustment independent of the irradiation conditions of the sample with the electron beam is impossible, the use of the irradiation optical system is restricted to a range permitted by the irradiation conditions on the sample.

FIG. 9B shows a non-magnetic lens of the type in which a gap of the pole piece 75 of the objective lens is provided below the sample. FIG. 9B shows an example of the non-magnetic lens of the type called a Lorenz lens. Although not shown, an objective lens of the type in which the directions of a magnetic fields generated by an upper pole and a lower pole of the sample are reversed so that the generated magnetic fields cancel each other, and resultantly the magnetic field applied to the sample becomes zero can be also used. Further, as shown in FIG. 9C, an electron optical system in which a magnetic field immersion of the sample is zeroed by largely separating a sample position from a magnetic path of the objective lens may be configured.

In either case, an imaging system with a long focal length is required for the first lens (objective lens) that forms the image of a magnetic sample, and the use of a weakly excited lenses is mainly considered. On the other hand, when the dielectric sample is to be observed, the magnetic field immersion of the sample has no problem so that a normal objective lens (magnetic field immersion type lens) can be also used. However, when weak deflection due to dielectric polarization is to be observed, an optical system with small-angle diffraction is required, and therefore, in that case, an imaging optical system of a long focus type similar to the magnetic sample observation is required from a request for the focal length of the lens. Preferably, an imaging optical system in which at least one of the electron lenses has a focal length of 10 mm or more is used.

Example 3

The present example is an example of an electron microscope configured to apply a magnetic field to a sample by using a magnetic field application device, or to apply a magnetic field by using a magnetic field generated by electron lenses configuring an objective lens system.

When the first imaging of the sample is formed by using the objective mini lens 51 below the objective lens or the magnifying lens below the objective lens while the objective lens shown in FIG. 9A is turned off, the objective lens 5 turned off can be used not as a lens but as a magnetic field application device. In this case as well, it is essential to converge the electron beam to the aperture plate 56 below the objective lens, and the electron beam is converged on the plane of the aperture plate 56 as a composite lens of the magnetic field applied to the objective lens 5 and the lens system below the objective lens 5, as shown in FIG. 10D(d). In order to converge the electron beam on the plane of the aperture plate 56, the configuration including the irradiation optical system can be used. However, in that case, since the adjustment independent of the irradiation conditions of the sample with the electron beam is impossible, the use of the irradiation optical system is restricted to a range permitted by the irradiation conditions on the sample.

Example 4

The present example is an example of an electron microscope in which an image of a source of an electron beam is formed on a plane of an aperture plate of an aperture device by using an irradiation lens system, an objective lens system, or both of the irradiation lens system and the objective lens system.

In the electron optical system of the electron microscope shown in FIGS. 3 and 6, it is essential to not only implement the hollow-cone illumination but also form the image of the source on the aperture plate plane below the sample. In other words, the image of the electron beam source must be formed on the aperture plate plane of the aperture device. This means that a diffraction space is formed in the aperture plate to select and control the spatial frequency of the electron beam that has passed through the sample. This is the same requirements as those of Foucault method, which are requirements added to the optical system of the small-angle diffraction optical system in the present invention that mainly targets weak phase objects such as magnetic materials.

Figure 10A:
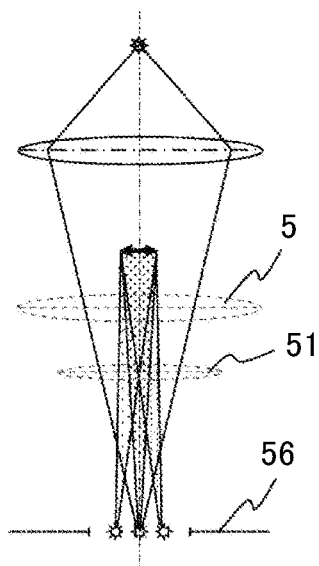
FIGS. 10A-10D are schematic diagrams of an optical system forming a diffraction spot to an aperture plate plane according to Examples 3 and 4.
Figure 10B:
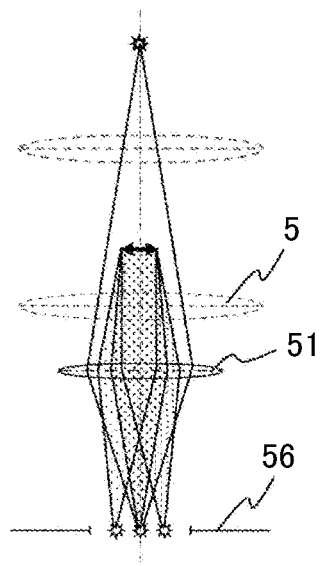
Figure 10C:
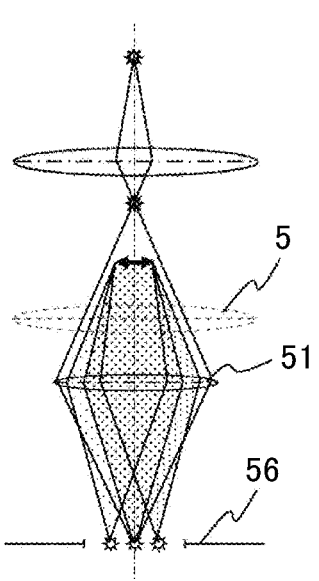
Figure 10D:
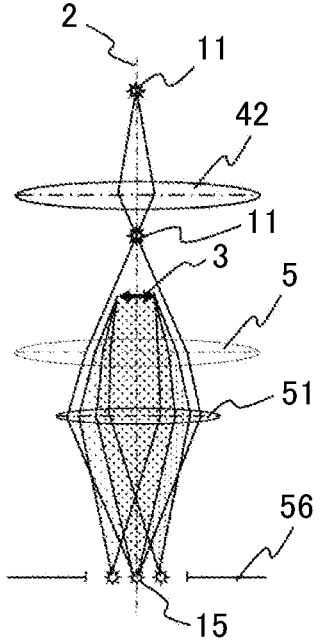

FIGS. 10A-10D show various optical systems of imaging the image of the electron source to the aperture plate plane below the sample. It should be noted that the deflectors 43 and 44 in the irradiation optical system for the hollow-cone illumination shown in FIGS. 3 and 6 are omitted. FIG. 10A shows a case using only the irradiation lens system, FIG. 10B shows a case using only the objective mini lens, FIG. 10C shows a case using the irradiation lens system and the objective mini lens, and FIG. 10D shows a case where a weak magnetic field is generated in the objective lens in addition to FIG. 10C.

That is, FIG. 10A shows an optical system when both lenses of the objective lens 5 and the objective mini lens 51 are turned off as indicated by broken lines. The image of the source is formed on a plane of the aperture plate 56 below the sample by using the irradiation lens. The optical system is simplest, but since the formation of the source image on the plane of the aperture plate 56 is prioritized, the correction of the irradiation conditions (for example, the adjustment of the irradiation region size) to the sample cannot be performed in the optical system.

FIG. 10B shows an optical system when the image of the source is formed on the aperture plate plane 56 by using only the objective mini lens 51. The optical system can be adjusted independently of the irradiation optical system. The lens of the irradiation optical system is drawn with a broken line as if the irradiation system lens is turned off, but this is due to convenience of drawing for indicating no dependency on the irradiation optical system, including the irradiation optical system turned off.

FIG. 10C shows an optical system when the image of the source is formed on the aperture plate plane with the objective mini lens 51 as in FIG. 10B. FIG. 10C shows that the crossover 11 (image of the electron source) is formed on a top of the sample by the lens of the irradiation optical system, and the irradiation conditions to the sample is actively controlled.

FIG. 10D is a diagram in which the objective lens 5 is weakly excited under the conditions of FIG. 10C, and the image of the source is formed on the plane of the aperture plate 56 by a composite lens of the objective lens 5 and the objective mini lens 51. This is the same configuration of the optical system in the case where the objective lens is used as the magnetic field application device, which has been described in Example 3.

Example 5

Example 5 is an example related to a relationship between an orbital illumination time of the hollow-corn illumination and an image recording time. In other words, Example 5 is an example of the electron microscope configured so that the record of the image of the sample or the diffraction pattern of the sample, or the image of the source of the electron beam synchronizes with the orbiting action in all azimuth angles around the optical axis of the electron beam by two stages of electron beam defectors.

Figure 11A:
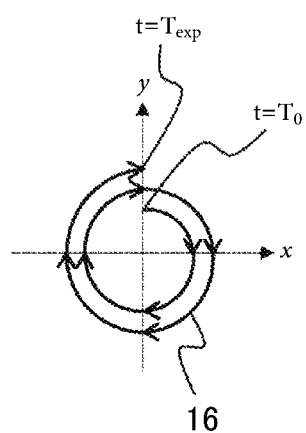
FIGS. 11A-11C are schematic diagrams of a trajectory of a zero-order diffraction pattern for showing a relationship between a circulation illumination time of a hollow-cone illumination and a recording time of an image according to Examples 5 and 6.
Figure 11B:
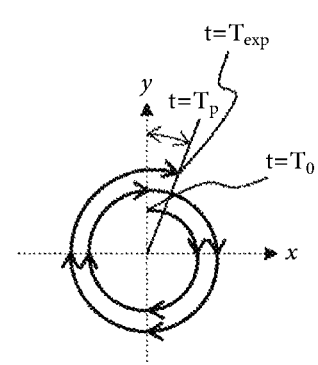
Figure 11C:
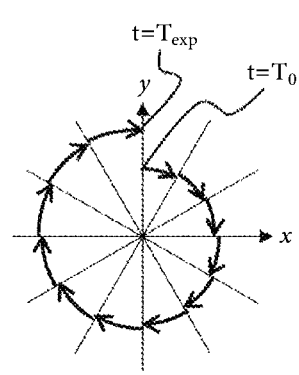

FIGS. 11A-11C are schematic diagrams of the trajectory of the $0^{th}$-order diffraction pattern for showing a relationship between the orbital illumination time of the hollow-corn illumination and the image recording time. FIG. 11A shows a case where synchronization is performed with two laps, FIG. 11B shows a case where the time is longer by $T\rho$ than the two laps, and FIG. 11C shows a case where the records for each azimuth angle not satisfying the lap are continuous.

A preferred relationship between a timing of the orbital illumination of the hollow-cone illumination and a timing of record in recording medium will be described with reference to FIGS. 11A-11C. FIGS. 11A-11C schematically show the orbiting trajectory 16 of the $0^{th}$-order diffraction spot on the diffraction plane, the record of the sample image starts from the innermost $t=T_0$ and the record ends $t=T_{exp}$.

That is, FIG. 11A shows the recording time with just orbiting twice (exposure time), the azimuth angles of the record start ($t=T_0$) and the record end ($t=T_{exp}$) coincide with each other and are drawn on a position direction of a y-axis in the drawing, and the recording time synchronizes with the orbit of the hollow-cone illumination. On the other hand, in FIG. 11B, a time lag of $t=T\rho$ occurs between the azimuth angle (positive direction of the y-axis) of the record start ($t=T_0$) and the azimuth angle of the record end ($t=T_{exp}$). Because of the time lag, images different in the exposure time are superimposed on each other depending on the azimuth angle on the recorded image. When the contrast of the recorded image is dealt with quantitatively, it is desirable that this difference is small. In other words, the difference is relatively reduced as the number of orbits is larger. Empirically, when four or more laps are carried out, this difference becomes inconspicuous visually. However, the stability of the device, especially, an influence of a position drift of the sample is more remarkable as the exposure becomes longer. It is desirable that one image record is performed within the exposure time of about 10 seconds at the longest, that is, for every ten or fewer laps. In general, when taking the stability of the device and the drift of the sample into account, it is preferable that in the synchronization of the record of the image of the sample or the diffraction pattern of the sample, or the image of the source of the electron beam with the orbiting action in all azimuth angles around the optical axis of the electron beam, one record is carried out for every one or more and ten or less laps. However, when accuracy of the orbiting mechanism in all azimuths is high (shape of the trajectory of the diffraction pattern is not distorted), and the high stability is obtained, it is desirable to increase the number of laps for one record more, and ten or more laps are acceptable.

Example 6

Example 6 is an example configured so that the record of the image of the sample, the diffraction pattern of the sample, or the image of the source of the electron beam is synchronized with the orbiting action in all azimuth angles around the optical axis of the electron beam, one record is performed for a predetermine azimuth angle from the azimuth angles 1° to 360° of the orbit, and the record is continuously performed over the entire lap of the azimuth angle.

FIG. 11C shows a case where records for each azimuth angle less than the lap are continuous as described above, which is an effective configuration when a recent high-speed and high-precision recording medium is used. According to this configuration, the orbit of the hollow cone illumination is divided into n equal parts, and each part is recorded so that the bright field/dark field image for azimuth angle $2\pi/n$ can be acquired. In FIG. 11C, n=12 is drawn as an example. This example corresponds to recording of an individual Foucault image for each azimuth angle. As shown in FIGS. 11A and 11B, when the bright field/dark field image in all orientations are required, the n images may be integrated and displayed again.

In FIG. 11A to 11C, the orbit trajectory of the 0 th-order diffraction spot extends outward as swirling, but this illustration is a drawing convenience for preventing the result trajectories of the orbit from overlapping with each other, and the trajectory does not necessarily spread outward during exposure (that is, the inclination angle with respect to the optical axis increases). Naturally, as shown in FIGS. 7A-7E, the trajectory may spread as in the figures.

Example 7

Example 7 is an example of a relationship between an aperture opening (hole) and a diffraction pattern in a hollow-cone illumination, that is, a relationship between an inclination angle of the orbit illumination of the hollow-cone illumination, and a diffraction pattern and an aperture size in an aperture plate plane (diffraction space). FIGS. 12A-12D correspond to a case where the drawing of FIGS. 2A-2D are viewed on a diffraction plane.

That is, Example 7 is an example of an electron microscope configured so that an electron beam that has passed through the sample passes through an aperture device to form an image on an observation plane, or an electron microscope configured so that a direct electron beam that has passed through the sample is shielded by the aperture device, and the electron beam that has been scattered by the sample forms an image on the observation plane, and further an electron microscope configured so that a part of a direct electron beam that has passed through the sample is shielded by the aperture device, and the direct electron beam that has passed through the aperture device without being shielded and passed through the sample and the electron beam that has been scattered by the sample form an image on the observation plane.

FIGS. 12A-12D show a case where the diffraction pattern orbits in a circle as indicated by a trajectory 16 of the diffraction pattern, and a case where the opening shape of the aperture plate 56 is circular, in the hollow-cone illumination when an inclination angle is held constant with respect to the optical axis. However, Example 7 is not limited to the above conditions. In FIGS. 12A-12D, three diffraction patterns 15 are drawn, but this example does not show the selection of the three diffraction patterns, but illustrates three orientations among the orbiting diffraction patterns.

Figure 12A:
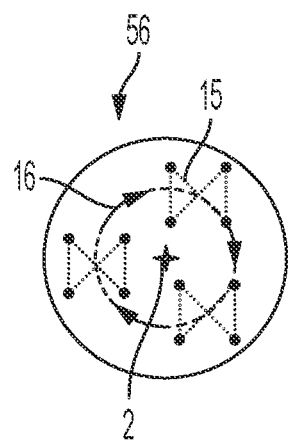
FIGS. 12A-12D are schematic diagrams showing a relationship between an opening of the aperture plate and a diffraction pattern in the hollow-cone illumination according to Example 7.
Figure 12B:
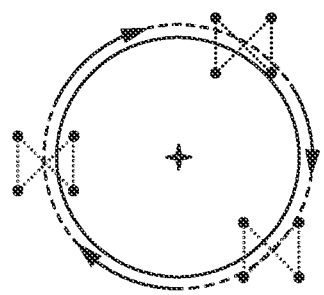
Figure 12C:
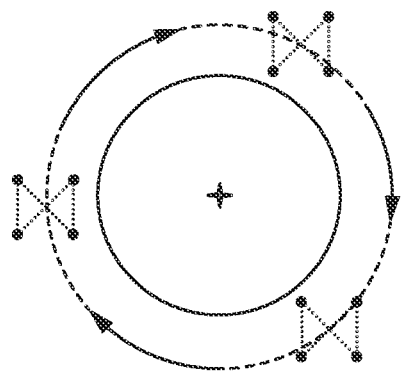

FIG. 12A shows a bright field image in which the inclination angle is small and almost the entire area of the diffraction pattern orbits in the aperture. When the inclination angle is zero or extremely small, the bright field image coincides with a simple bright field image. That is, it is not found that the hollow-cone illumination is applied. Since the electron beams with an inclination relatively large deflection angle are first shielded, the image by the electron beam propagates in the optical axis direction at a small deflection angle is brightly recorded. For that reason, in the experimental results to be described later, the Bloch domain wall is observed brightly with respect to the background magnetic domain image. FIG. 12B shows a dark field image when the main deflection of the scattered wave is not shielded. However, the electron beam deflected by each magnetic domain is under a condition for passing through the aperture. In the experimental results to be described later, the electron beam transmitted through the Bloch domain wall is shielded and darkly recorded relative to the background magnetic domain. An image of FIG. 12C is a dark field image by only an electron beam largely deflected. Further, in the experimental result shown in FIG. 14D, since almost all the electron beams deflected by both components of the magnetic domain deflection and the domain wall deflection are shielded, the image reflects only the shape of the sample.

Figure 12D:
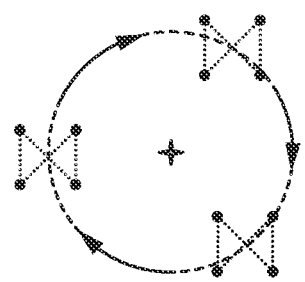

FIG. 12D shows a condition in which the trajectory of the 0 th-order diffraction spot corresponding to the optical axis exactly matches an opening edge of a circular opening of the aperture plate and exactly half of the diffraction pattern is shielded, that is, a Schlieren condition. In the experimental results to be described later, since the electron beam that has passed through the magnetic domain and the electron beam that has passed through the Bloch domain wall are shielded at almost the same ratio, none of the magnetic domain and the domain wall is observed. However, when the contrast is adjusted to draw a space around a sample piece, the contrast that gushes out from the sample piece in space is observed as in the experimental results to be described later in FIG. 15. This is a contrast by a leakage magnetic field emitted from the sample piece toward the outside of the sample. Because of a non-linear imaging, the contrast is not quantitative, but it is found that the shade of the magnetic field is qualitatively found, and spreads widely in the space. The observation of a magnetic field distribution in the space is the observation results specific to the present example which cannot be obtained by a conventional Lorenz microscopy (Foucault method/Fresnel method).

Example 8

Example 8 is an example of an electron microscope configured so that the opening shape of the aperture plate of an aperture device is a triangle, a quadrangle, a pentagon or a hexagon, or the aperture shape of the aperture plate of the aperture device is a polygon having a distorted shape including an ellipse.

In each of the previous examples, FIGS. 7A-7E show examples in which the orbital shapes on the diffraction plane (aperture plate plane) have various shapes other than circle by giving an azimuth angle dependency to the inclination angle of the hollow-cone illumination with respect to the circular aperture plate. On the other hand, configurations are conceivable in which the orbital shape on the diffraction plane of the hollow-cone illumination is circular, and the shape of the aperture opening is, for example, a polygon such as a triangle or a square, or strongly depends on the azimuth angle such as a rectangle. The other experimental conditions such that the orbital shape on the diffraction plane of the hollow-cone illumination and the shape of the opening are relatively equivalent to each other, and each changed, or both of those shapes are changed in correlation with each other, are conceivable. That is, the image of the sample can be obtained with the opening shape of the aperture plate of the aperture device as polygon such as triangle, quadrangle, pentagon, and hexagon, or the opening shape of the aperture plate of the aperture device as a polygon with a distorted shape including an ellipse.

Figure 13A:
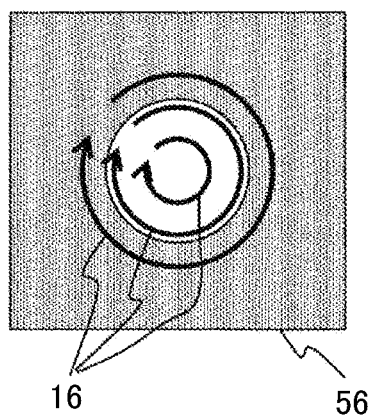
FIGS. 13A-13D are schematic diagrams showing a relationship (bright field image/schlieren image/dark field image) between a shape of an opening of the aperture plate and a diffraction pattern in the hollow-cone illumination according to Example 8.
Figure 13B:
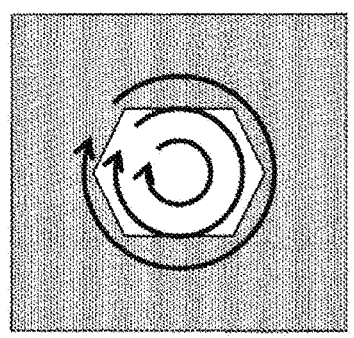
Figure 13C:
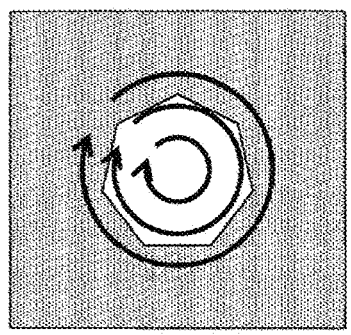
Figure 13D:
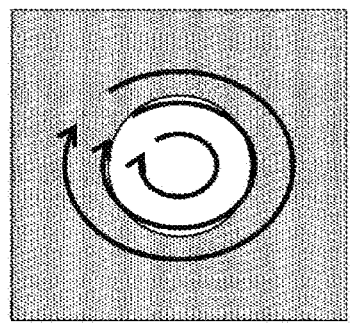

FIGS. 13A-13D show schematic diagrams illustrating, as Example 8, three patterns of a bright field (inside), Schlieren (center), and dark field (outside) as the trajectories of the $0^{th}$-order diffraction spot on the diffraction plane when the orbital illumination with various shapes is implemented on the opening shape of various aperture plate. FIG. 13A shows a circular orbital illumination as indicated by a circular opening and a trajectory 16 of a diffraction pattern. FIG. 13B shows a circular orbital illumination for a horizontally long hexagonal aperture, FIG. 13C shows a circular orbital illumination for a regular heptagonal opening, and FIG. 13D shows a horizontal elliptical orbital illumination for a circular opening. In the cases other than the circular opening and the circular orbital illumination, the Schlieren conditions can be exactly met over all azimuth angles. However, in an integral image over all azimuths, the Schlieren condition is tolerated. If the relationship between the aperture shape and the shape of the orbital illumination can be selected, the magnetic domain structure and the domain wall can be observed with contrast at the same time in the in-focus image. That is, each magnetic domain is given a different contrast, and each domain wall can be given a contrast different from that of the magnetic domain. The results are shown in FIG. 14C, for example.

Example 9

As Example 9, the results of a trial experiment using the abovementioned electron microscope will be described with reference to FIGS. 14A-14D and FIGS. 15A-15C. All images shown in the figures are recorded in focus. The sample is a single crystal of FeGa, and thinned vertically and horizontally by a focused ion beam device to about 15 μm square, and about 200 nm thickness. The crystal orientation of the observation is not specified. Observation is performed at an acceleration voltage 200 kV by a transmission electron microscope equipped with a thermal field emission electron source. An orbital illumination period of the hollow-cone illumination is 0.8 Hz, an exposure time is 10 seconds, and a recording medium is a CCD camera. The number of laps described in Example 5 corresponds to n=8 under the experimental conditions of the orbital illumination period 0.8 Hz and the exposure time 10 seconds.

FIG. 14A shows an almost normal bright field image with an inclination angle of $2.2 \times 10^{-4}$ rad. FIG. 14B shows a hollow-cone Foucault image (bright field image) with an inclination angle of $5.6 \times 10^{-4}$ rad. The domain wall is observed in the bright field image with bright contrast. This is because the electron beam having a relatively large deflection angle is shielded, and therefore an image by the electron beam that has passed through the Bloch domain wall that propagates in the optical axis direction at a small deflection angle is brightly observed relative to the background magnetic domain image. FIG. 14C shows a hollow-cone Foucault image (dark field image) at an inclination angle $9.0 \times 10^{-4}$ rad. The domain wall is observed with dark contrast in the dark field image. This is because the electron beam reflected by each magnetic domain can pass through the aperture, but the electron beam that has passed through the Bloch domain wall is shielded and darkly observed relative to the background magnetic domain image. In addition, a first electron microscope image in which contrast slightly changes by each magnetic domain, and the magnetic domain and the domain wall are observed with the in-focus image is obtained. That is, the experimental results that well represents the novelty and inventive step of the method of the present invention are obtained. FIG. 14D shows a hollow-cone Foucault image (dark field image) at an inclination angle $12.7 \times 10^{-4}$ rad. Since the image is formed by only the electron beam with a high diffraction angle, the magnetic structure is hardly observed, and only the shape of the sample is observed.

FIGS. 15A-15C show a Schlieren image with an inclination angle of $7.0 \times 10^{-4}$ rad. FIGS. 15A and 15B display the same recorded image with different contrasts. FIG. 15A displays the image with the matched contrast of the inside of the sample, and FIG. 15B displays the image with the matched contrast of a space around the sample piece.

In FIG. 15A, in the sample image, there is no clear contrast between the magnetic domain and the domain wall. Since exactly half of the diffracted wave is shielded, and the sample image is the integral image over all azimuth angles, the intensity distribution of deflected electron beams from both the magnetic domain and the domain wall is lost at almost the same ratio, as a result of which the contrast is lost. In FIG. 15B, the contrast due to the leaked magnetic field emitted from the sample piece to the outside of the sample is observed. It is found that the magnetic field is widely unevenly distributed around the sample piece. Since the Schlieren image is a non-linear image, the contrast is not quantitative, but the shade of the magnetic field is quantitatively found. FIG. 15C shows a low-magnification image observed under the same conditions as FIG. 15B, and it is found that the leaked magnetic field spreads widely in the space. The observation of the magnetic field distribution in the space is the results that cannot be obtained by the conventional Lorenz microscopy (Foucault method/Fresnel method).

The above observation results are observation images that cannot be obtained with a conventional electron microscope, and are the results presenting the effectiveness and the industrial usability of the electron microscope and the sample observation method using the electron microscope according to the various examples described above.

Example 10

Figure 16:
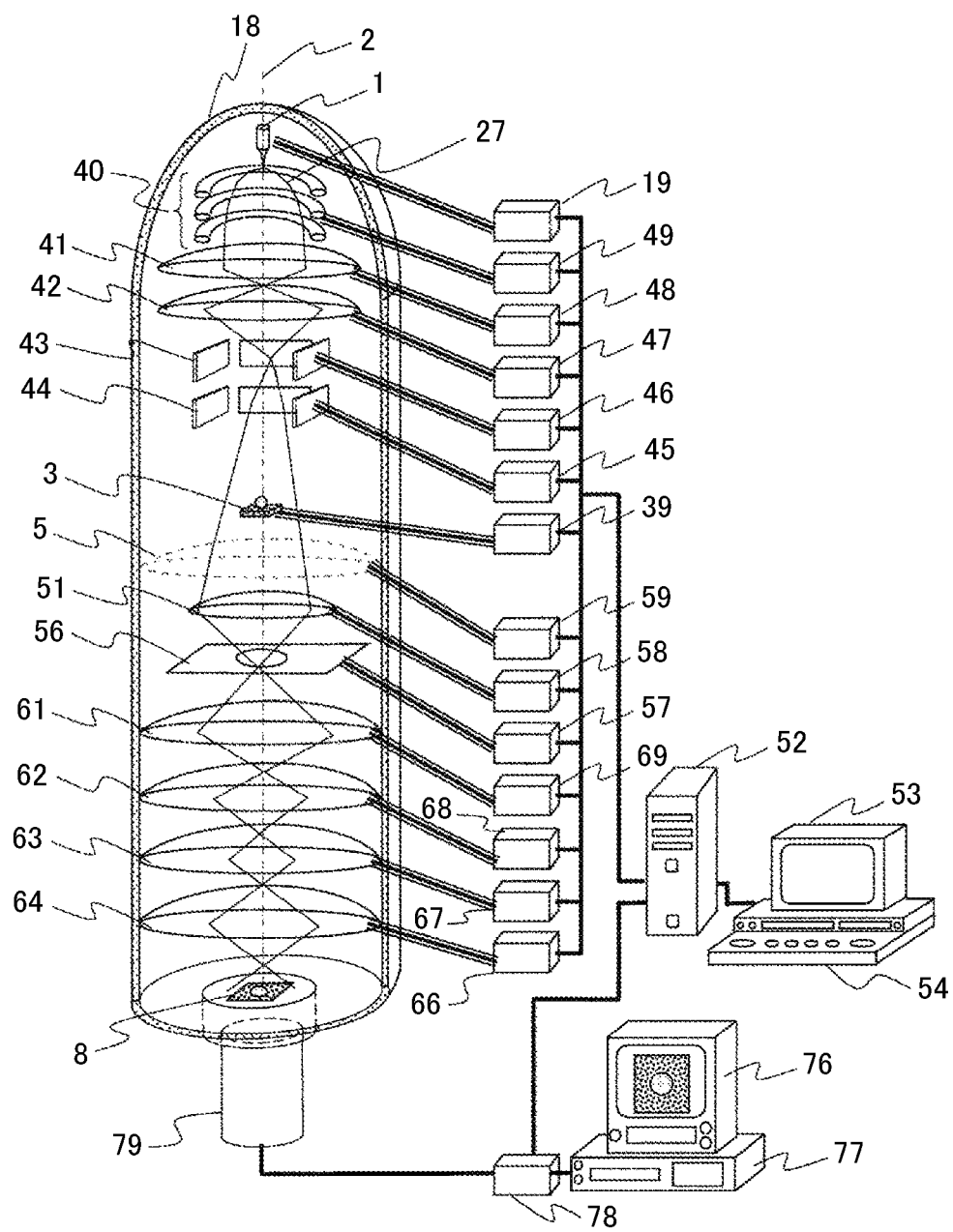
FIG. 16 is a schematic diagram illustrating an outline of a device used for a transmission electron microscope according to Example 10.

Example 10 is an example of a device used for a transmission electron microscope. FIG. 16 is a schematic diagram assuming a configuration when the transmission electron microscope of the present example is used for an interference microscope, but the present example is not limited to a configuration illustrated in the schematic diagram.

In FIG. 16, an electron gun 1 as the electron source is located at the most upstream in a direction in which the electron beam flows, and the electron beam is set to a predetermined speed by an acceleration tube 40, and then a sample 3 mounted on a sample holding device not shown is irradiated with the electron beam through a first irradiation (condenser) lens 41 and a second irradiation (condenser) lens 4, which are the irradiation optical system. In FIG. 16, the electron beam that has passed through the sample 3 is converged on an opening of an aperture plate 56 below an objective mini lens by the objective mini lens 51. An image of the sample 3 is finally formed on an observation recording plane 8 of the electron beam device by multiple imaging lens systems on the downstream side in a travel direction of the electron beam, that is, a first imaging lens 61, a second imaging lens 62, a third imaging lens 63, and a fourth imaging lens 64. The image is recorded in an image recording device 77 through an image observation/recording medium 79 such as a CCD camera and a control unit 78 of the image observation/recording medium, and displayed on a monitor 76 with a GUI function of the image observation/recording device.

In the configuration of the transmission electron microscope according the present example, the hollow-cone illumination is performed by two-stage deflectors 43 and 44 at a top of the sample, and deflected with an appropriate time change in the X and Y directions to change only the irradiation angle to the sample 3 according to the azimuth angle. In the hollow-cone illumination, if the inclination angle and azimuth angle of the incident electron beam are adjusted to be change without changing the irradiation area on the sample plane, a suitable observation can be realized without detection of a direct influence by the irradiation at the time of the ample image observation.

Further, the respective elements of the voltages applied to the electron source 1 and the acceleration tube 40, the position and the inclination angle of the sample 3, an excitation state of each electron lens, and the operation state of the two-stage deflectors 43 and 44 at a top of the sample are controlled by a computer 52 which is an information processing unit for controlling the entire device. In other words, the device is controlled by the control system computer 52, an electron source control unit 19, a sample control unit 39, a second irradiation lens control unit 47, a first irradiation lens control unit 48, an acceleration tube control unit 49, an objective lens control unit 59, an objective mini lens control unit 58, a fourth imaging lens control unit 66, a third imaging lens control unit 67, a second imaging lens control unit 68, a first imaging lens control unit 69, and so on, which are control systems of the device of each unit connected to the control system computer 52.

The control system computer 52 is equipped with a numerical processing unit not shown, a storage unit such as a memory and a storage device, and an input/output device 53 in the normal computer configuration. The input/output device 54, which is an interface, includes a monitor 53 and includes a GUI function for entering control parameters necessary to control the device and observe the sample, the observation conditions, and so on by a user. The storage unit stores information on various parameters required for the observation condition search of the device or the operation control. For example, tabled values of parameters of the deflection amount required for controlling the control units 46 and 45 of the two-stage deflectors and controlling the inclination angle of the hollow-cone illumination, and so on may be recorded in an information storage memory. Alternatively, various types of software for determining the above parameters may be stored in a storage unit for program storage, and those types of software may be executed by an arithmetic unit.

In an actual device, in addition to the components shown in this schematic diagram, there are a deflection system for obtaining a normal image, a movable aperture mechanism for limiting the electron beam transmission amount, and the transmission area, and so on, and those components are also controlled by a control system (device control units) connected to the computer 52. However, since those devices are not directly related to the present invention, those devices are omitted in the figure. As shown in the schematic diagram, electro-optical elements are assembled in a vacuum container 18 and continuously exhausted by a vacuum pump. However, the vacuum exhaust system is not directly related to the present invention, and is omitted.

According to the present invention described in detail above, the Foucault method observation is realized by using the hollow-cone illumination that orbits and illuminates an incident electron beam inclined to an optical axis over all orientations around the optical axis, an electron wave is converged at a position (height) of the aperture plate downstream of the sample along the electron beam, and a bright field condition in which a direct transmitted wave of the sample passes through the aperture plate as it is, a dark field condition in which the transmitted wave is shielded by the aperture plate, and a Schlieren condition in which approximately half of the transmitted electron wave is shielded as a boundary condition of both of the above conditions are controlled according to an inclination angle of the incident electron beam. In addition, the type of the observation image, that is, a region of the deflection source (domain) is observed, a local boundary portion (domain wall) of the region of the deflection source is observed, or both of the region (domain) and the local boundary portion (domain wall) are observed by selecting the multiple opening diameters and opening shapes of the aperture plate, and an observation method for selecting and controlling a spatial resolution can be realized.

Further, according to the present invention, with the use of a transmission electron microscope, not only a magnetization distribution such as a magnetic domain structure of a magnetic material and an electromagnetic structure such as a polarization structure of dielectric material can be observed with a higher resolution than that in the conventional method (Fresnel/Foucault) and in-focus, but also a spatial distribution of the electromagnetic field around the sample piece can be visualized. Further, the structures of a weakly scattered material/weakly phase material for electron waves such as a biological sample and an organic material can be observed. When observing magnetic materials, the magnetic field generated by the electron lens can be devised so as not to affect the sample.

The present invention is not limited to the above-described examples and includes various modifications. For example, the above examples are described in detail for a better understanding of the present invention, and the present invention is not necessarily limited to the provision of all the configurations described.

Further, an example of creating a program for realizing some or all of the abovementioned configurations, functions, control system computers, etc. has been mainly described. However, some or all of those configurations, functions, and computers may be designed by, for example, an integrated circuit and realized by hardware. In other words, the overall or partial functions of the processing unit may be realized by an integrated circuit such as ASIC (application specific integrated circuit), and FPGA (field programmable gate array) instead of the program.

The description of the present specification described above in detail includes various inventions other than the inventions defined in the claims. Some of the inventions are listed below.

<List 1>
An electron microscope comprising:
a source of an electron beam;
an irradiation lens system including at least two electron lenses for irradiating a sample with the electron beam emitted from the source;
a sample holding device for holding the sample irradiated with the electron beam;
an objective lens system for forming an image of the sample and including at least one electron lens, the at least one electron lens having a focal length of 10 mm or more;
an aperture device that is disposed downstream of the sample holding device in a travel direction of the electron beam;
an imaging lens system that is disposed downstream of the aperture device in the travel direction of the electron beam;
an observation plane that observes the image of the sample by the imaging lens system or an image of the source of the electron beam, that is, a diffraction pattern of the sample;
a recording device for recording the image of the sample or the diffraction pattern of the sample; and
at least two stages of electron beam deflectors that are disposed between the source of the electron beam and the sample holding device,
wherein the image of the source of the electron beam is formed on a plane of the aperture plate of the aperture device,
the irradiation angle to the sample is changed while the irradiation area of the electron beam on the sample is kept constant by adjusting a deflection action of each stage of the two-stage electron beam deflectors, and
the irradiation of the sample with the electron beam is continuously changed in a predetermined inclined angle range while the irradiation is orbited in all azimuth angles around the optical axis.

<List 2>
The electron microscope according to List 1,
wherein the irradiation of the sample with the electron beam is continuously orbited in all azimuth angles around the optical axis while the irradiation is held constant at a predetermined irradiation angle.

<List 3>

A sample observation method using an electron microscope that includes:

a source of an electron beam;

an irradiation lens system including at least two electron lenses for irradiating a sample with the electron beam emitted from the source;

a sample holding device for holding the sample irradiated with the electron beam;

an objective lens system for forming an image of the sample and including at least one electron lens, the at least one electron lens having a focal length of 10 mm or more;

an aperture device that is disposed downstream of the sample holding device in a travel direction of the electron beam;

an imaging lens system that is disposed downstream of the aperture device in the travel direction of the electron beam;

an observation plane that observes the image of the sample by the imaging lens system or an image of the source of the electron beam, that is, a diffraction pattern of the sample;

a recording device for recording the image of the sample or the diffraction pattern of the sample; and at least two stages of electron beam deflectors that are disposed between the source of the electron beam and the sample holding device, the method comprising: forming the image of the source of the electron beam on a plane of the aperture plate of the aperture device;

changing the irradiation angle to the sample while the irradiation area of the electron beam on the sample is kept constant by adjusting a deflection action of each stage of the two-stage electron beam deflectors; and adjusting the irradiation of the sample with the electron beam to be continuously changed at a predetermined inclined angle while being continuously orbited in all azimuth angles around the optical axis, or to be continuously orbited in all azimuth angles around the optical axis while the irradiation angle is kept constant at a predetermined angle to obtain the image of the sample.

<List 4>

The sample observation method using the electron microscope according to List 3, wherein the record of the image of the sample or the diffraction pattern of the sample is synchronized with the orbiting action of the electron beam in all azimuth angles around the optical axis;

a direct electron beam passing through the sample passes through the aperture device and forms an image on the observation plane, or the direct electron beam passing through the sample is shielded by the aperture device and the electron beam scattered by the sample forms an image on the observation plane, and further a part of the direct electron beam passing through the sample is shielded by the aperture device, and the direct electron beam passing through the aperture device without being shielded and passing through the sample and the electron beam scattered by the sample form an image on the observation plane to obtain the image of the sample.

<List 5>

The sample observation method using the electron microscope according to List 3 or 4, wherein the image of the sample is obtained with an opening shape of the aperture plate of the aperture device as a polygon such as triangle, quadrangle, pentagon, or hexagon, or the opening shape of the aperture plate of the aperture device as a polygon of a distorted shape such as an ellipse.

The sample observation method according to the list 3 or 4.

REFERENCE SIGNS LIST

1: electron source or electron gun
11: crossover
12: crossover plane
13, 17: crossover trajectory
15: diffraction pattern
16: diffraction pattern trajectory
18: vacuum container
19: electron source control unit
2: optical axis
3: sample
39: sample control unit
40: acceleration tube
41: first irradiation lens
42: second irradiation lens
43: first deflector
44: second deflector
45: second deflector control unit
46: first deflector control unit
47: control unit of second irradiation lens
48: control unit of first irradiation lens
49: acceleration tube control unit
5: objective lens
51: objective mini lens
52: control system computer
53: monitor of control system computer
54: interface of control system computer
56: aperture opening, aperture plate or aperture device
57: aperture device control unit
58: control unit of objective mini lens
59: objective lens control unit
61: first intermediate lens
62: second intermediate lens
63: third intermediate lens
64: projection lens
66: projection lens control unit
67: control unit of third intermediate lens
68: control unit of second intermediate lens
69: control unit of first intermediate lens
7: sample image
71: image plane of sample
72: second image plane of sample
75: pole piece
76: image display device
77: image recording/numerical processing unit
78: control unit of image observation/recording medium
79: Image observation/recording medium
8: image observation plane
91: magnetic domain
92: domain wall

The invention claimed is:

1. An electron microscope comprising:
a source of an electron beam;
an irradiation lens system including at least two electron lenses for irradiating a sample with the electron beam emitted from the source;
an objective lens for forming a first image of the sample;
an aperture plate that is disposed downstream of the sample in a travel direction of the electron beam;

a plurality of imaging lenses disposed downstream of the aperture plate in the travel direction of the electron beam and configured to form at least a second image of the sample on an observation plane that observes the image of the sample by the imaging lens system or an image of the source of the electron beam comprising a diffraction pattern of the sample;

a recording device configured to store the second image of the sample or the diffraction pattern of the sample; and at least two stages of electron beam deflectors that are disposed between the source of the electron beam and the sample, wherein the image of the source of the electron beam is formed on a plane of the aperture plate, and wherein a computer is configured to control the irradiation of the sample with the electron beam by orbiting the electron beam in all azimuth angles around the optical axis while maintaining an irradiation angle to the sample within a predetermined range by adjusting, by the computer, a deflection action of each of the at least two stages of electron beam deflectors.

2. The electron microscope according to claim 1, wherein the irradiation of the sample with the electron beam is orbited around the optical axis while being kept constant at a predetermined irradiation angle.

3. The electron microscope according to claim 1, wherein an electron lens configuring the objective lens system is a non-magnetic lens for the sample.

4. The electron microscope according to claim 1, wherein a magnetic field is applied to the sample using a pole piece of the objective lens, or the magnetic field is applied to the sample using a magnetic field generated by an electron lens of the objective lens.

5. The electron microscope according to claim 1, wherein the image of the source of the electron beam is formed on a plane of the aperture plate by using the irradiation lens system, using the objective lens, or using both of the irradiation lens system and the objective lens.

6. The electron microscope according to claim 1, wherein the computer is further configured to record the second image of the sample, the diffraction pattern of the sample, or the image of the source of the electron beam in synchronization with an orbiting action of the electron beam in all azimuth angles around the optical axis by the at least two stages of the electron beam deflectors.

7. The electron microscope according to claim 1, wherein the computer is further configured to record the second image of the sample, the diffraction pattern of the sample, or the image of the source of the electron beam in synchronization with the orbiting action of the electron beam in all azimuth angles around the optical axis, and wherein one recording is performed for one or more and ten or less orbits.

8. The electron microscope according to claim 1, wherein the computer is further configured to record the second image of the sample, the diffraction pattern of the sample, or the image of the source of the electron beam in synchronization with an orbiting action of the electron beam in all azimuth angles around the optical axis, wherein one recording is performed for a predetermined azimuth angle of 1° to 360° of the orbit, and wherein said recording is performed continuously over all orbits of the azimuth.

9. The electron microscope according to claim 1, wherein a direct electron beam that has passed through the sample passes through the aperture plate and forms the second image on the observation plane.

10. The electron microscope according to claim 1, wherein a direct electron beam that has passed through the sample is shielded by the aperture plate, and the electron beam scattered by the sample forms the second image on the observation plane.

11. The electron microscope according to claim 1, wherein a part of a direct electron beam that has passed through the sample is shielded by the aperture plate, and the direct electron beam that has passed through the aperture plate without being shielded and passed through the sample and the electron beam that has been scattered by the sample form the second image on the observation plane.

12. The electron microscope according to claim 1, wherein an opening shape of an aperture plate is polygonal, circular, or elliptical.

13. A sample observation method using an electron microscope, the method comprising:

irradiating a sample with an electron beam emitted from an electron beam source via an irradiation lens system that includes at least two electron lenses;

forming an image of the sample using an objective lens;

directing said electron beam to an aperture plate that is disposed downstream of the sample in a travel direction of the electron beam;

directing said electron beam to a plurality of imaging lenses system that is disposed downstream of the aperture plate in the travel direction of the electron beam;

observing the image of the sample at an observation plane formed by the plurality of imaging lenses system or a diffraction pattern of the sample;

recording the image of the sample provided by the imaging lens system or the diffraction pattern of the sample;

controlling said electron beam using at least two stages of electron beam deflectors that are disposed between the electron beam source and the sample;

forming the image of the electron beam source on a plane of the aperture plate; and orbiting the irradiation of the sample with the electron beam in all azimuth angles around the optical axis while an irradiation angle to the sample is kept within a predetermined range by adjusting a deflection action of each of the two stages of electron beam deflectors to obtain the image of the sample.

14. The sample observation method using the electron microscope according to claim 13, further comprising irradiating the sample with the electron beam by orbiting the electron beam around the optical axis while maintaining an irradiation angle of the electron beam at a constant predetermined irradiation angle.

15. The sample observation method using the electron microscope according to claim 13, wherein an opening shape of an aperture plate is polygonal, circular, or elliptical.

* * * * *